United States Patent
Atohira et al.

(10) Patent No.: US 9,519,736 B2
(45) Date of Patent: Dec. 13, 2016

(54) DATA GENERATION DEVICE FOR VISION SENSOR AND DETECTION SIMULATION SYSTEM

(71) Applicant: FANUC Corporation, Yamanashi (JP)

(72) Inventors: Hiroyuki Atohira, Yamanashi (JP); Yoshiharu Nagatsuka, Yamanashi (JP)

(73) Assignee: FANUC CORPORATION, Yamanashi (JP)

( * ) Notice: Subject to any disclaimer, the term of this patent is extended or adjusted under 35 U.S.C. 154(b) by 0 days.

(21) Appl. No.: 14/602,816

(22) Filed: Jan. 22, 2015

(65) Prior Publication Data

US 2015/0202776 A1    Jul. 23, 2015

(30) Foreign Application Priority Data

Jan. 23, 2014    (JP) .................................. 2014-010363

(51) Int. Cl.
| | |
|---|---|
| *G06F 17/50* | (2006.01) |
| *B25J 9/16* | (2006.01) |
| *G06F 19/00* | (2011.01) |
| *G05B 19/401* | (2006.01) |

(52) U.S. Cl.
CPC .......... *G06F 17/5009* (2013.01); *B25J 9/1671* (2013.01); *G05B 2219/39031* (2013.01); *Y10S 901/47* (2013.01)

(58) Field of Classification Search
CPC .................. B25J 9/1671; B25J 9/1692; G05B 2219/39031; G05B 2219/39391; G05B 2219/39024; G05B 2219/39016; G05B 19/401; G05B 2219/39055; G06F 17/5009; Y10S 901/47; Y10S 901/46; G05D 2219/59057; G05D 3/00; G06T 7/0018

See application file for complete search history.

(56) References Cited

U.S. PATENT DOCUMENTS

| | | | |
|---|---|---|---|
| 7,974,462 | B2 | 7/2011 | Takemoto et al. |
| 8,095,237 | B2 * | 1/2012 | Habibi .................. B25J 9/1692 29/702 |
| 2006/0229766 | A1 | 10/2006 | Setsuda |

(Continued)

FOREIGN PATENT DOCUMENTS

| | | |
|---|---|---|
| CN | 1843710 A | 10/2006 |
| DE | 602004013107 T2 | 7/2009 |

(Continued)

*Primary Examiner* — Dale Moyer
(74) *Attorney, Agent, or Firm* — Hauptman Ham, LLP (57) ABSTRACT

A data generation device and a detection simulation system, capable of executing offline simulation using a vision sensor, without calibration for associating the vision sensor with the robot. The device has: a placing part which places three-dimensional models of a robot, a vision sensor and an object in a virtual space; a robot placement position designating part and a vision sensor placement position designating part which designate placement positions of the robot and the vision sensor in the virtual space, respectively, based on a reference coordinate system defined in the virtual space; a placement position storing part which stores the placement positions; a positional relationship calculating part which calculates a positional relationship between a robot coordinate system and a sensor coordinate system; and a positional relationship storing part which stores the positional relationship as data used in a detection process of the vision sensor.

6 Claims, 5 Drawing Sheets

(56) References Cited

U.S. PATENT DOCUMENTS

| | | | | |
|---|---|---|---|---|
| 2008/0013825 A1* | 1/2008 | Nagatsuka | ............ | B25J 9/1671 382/153 |
| 2008/0300723 A1 | 12/2008 | Ban et al. | | |
| 2009/0187276 A1 | 7/2009 | Nagatsuka et al. | | |
| 2014/0188274 A1* | 7/2014 | Namiki | ................. | B25J 9/1697 700/254 |

FOREIGN PATENT DOCUMENTS

| | | |
|---|---|---|
| EP | 2684651 A2 | 1/2014 |
| JP | 63-62003 A | 3/1988 |
| JP | H06-137840 A | 5/1994 |
| JP | H06-175712 A | 6/1994 |
| JP | H08-071972 A | 3/1996 |
| JP | H10-340112 A | 12/1998 |
| JP | 2001-216015 A | 8/2001 |
| JP | 2006-260271 A | 9/2006 |
| JP | 2006-272537 A | 10/2006 |
| JP | 2008-21092 A | 1/2008 |
| JP | 2009-6452 A | 1/2009 |
| JP | 2012-91280 A | 5/2012 |

* cited by examiner

DATA GENERATION DEVICE FOR VISION SENSOR AND DETECTION SIMULATION SYSTEM

RELATED APPLICATIONS

The present application claims priority to Japanese Application Number 2014-010363, filed Jan. 23, 2014, the disclosure of which is hereby incorporated by reference herein in its entirety.

BACKGROUND OF THE INVENTION

1. Field of the Invention

The preset invention relates to a data generation device for generating data used for a detection process by means of a vision sensor arranged in a virtual space, and a detection simulation system having the data generation device.

2. Description of the Related Art

In an offline simulation of the prior art, in order to detect the position and orientation of a workpiece in a robot system having a vision sensor, first, the positions of a robot, a vision sensor and a workpiece or a jig for holding the workpiece are determined, and then, calibration is carried out for associating the vision sensor with the robot.

For example, JP H06-137840 A discloses an automatic calibration device, wherein a calibration work having oval reference teaching points is captured by a camera, and the position of each teaching point on an image is identified based on the positions and orientations of the reference teaching points so as to be automatically associated with the position in a space. Then, a camera parameter is calculated using a set of image coordinate values and space coordinate values on each teaching point.

JP H06-175712 A discloses an automatic calibration method, wherein ink, etc., is painted on a bottom surface of a tool attached to a front axis of a robot, and the shape of the tool is transferred on an arbitrary coordinate plane. Then, a transferred image is captured from a plurality of positions by using a vision sensor attached to the front axis, the coordinate of the front axis of the robot is detected based on the captured data by using an image processor and a host computer, and the positional relationship between the front axis of the robot, the tool and the vision sensor is calculated based on the coordinate.

JP H10-340112 A discloses a robot with automatic calibration function, wherein the robot has a robot body to which a robot hand for gripping a workpiece is attached, a camera, and an image processor. The robot further has a measurement piece formed in the shape of the workpiece, a means for measuring the position of the measurement piece based on an image of the measurement piece gripped by the robot hand and positioned on the camera, and a means for calculating the matching of the coordinates of the robot body and the camera based on the control position of the robot body and the position of the measurement piece.

Further, JP H08-071972 A discloses an automatic adjustment method, wherein a robot grips an alignment plate having circles at four corners thereof and moves the alignment plate along robot coordinate axes in each visual field of a camera and between each visual field. Then, the coordinate of the center of the circle in each visual field is calculated so as to carry out calibration and calculate an inclination of the camera based on a deviation between the circles on a camera coordinate, the coordinate of the center of the circle is calculated while the visual fields are overlapped with each other, and an amount of overlapping of the visual fields and a deviation of the camera axis are calculated based on the deviation between the circles on the camera coordinate.

As described above, some conventional techniques have been disclosed, in which the calibration is carried out to identify the positional relationship between the robot and the vision sensor. In such a calibration, measurement operation by using the vision sensor is necessary. Further, such a calibration requires special knowledge and a long period of time, which is a burden for man operator.

SUMMARY OF THE INVENTION

Therefore, an object of the present invention is to provide a data generation device and a detection simulation system, capable of carrying out offline simulation using a vision sensor, without carrying out calibration for associating the vision sensor with the robot.

According to one aspect of the present invention, there is provided a data generation device for generating data used in a detection process using a vision sensor, based on positions of three-dimensional models of a robot, the vision sensor and an object which are positioned in a virtual space, the data generation device comprising: a robot placement position designating part which designates a placement position of the robot in the virtual space based on a reference coordinate system defined in the virtual space; a vision sensor placement position designating part which designates a placement position of the vision sensor in the virtual space based on the reference coordinate system; a placement position storing part which stores the placement positions of the robot and the vision sensor; a positional relationship calculating part which calculates a positional relationship between a robot coordinate system defined in relation to the robot and a sensor coordinate system defined in relation to the vision sensor, based on the placement positions of the robot and the vision sensor; and a positional relationship storing pat which stores the positional relationship between the robot coordinate system and the sensor coordinate system as data used in a detection process of the vision sensor.

In a preferred embodiment, the data generation device further comprises: an object position designating part which designates a position of the object in the virtual space based on the reference coordinate system; and a CG image generating part which generates a computer graphics image which is a quasi-image corresponding to an image obtained when the object is captured by the vision sensor, based on a positional relationship between the vision sensor and the object.

In a preferred embodiment, the three-dimensional model of the vision sensor is attached to a movable part of the three-dimensional model of the robot.

According to another aspect of the present invention, there is provided a detection simulation system, comprising: the data generation device of the invention; and an image processor which carries out a detection process of the object by using the data used in the detection process of the vision sensor.

In a preferred embodiment, the image processor comprising: a detection processing part which carries out the detection process in relation to the computer graphics image by using the data; and an object position calculating part which calculates a position of the object based on a result of the detection process by the detection processing part.

In a preferred embodiment, the three-dimensional model of the vision sensor is attached to a movable part of the three-dimensional model of the robot.

BRIEF DESCRIPTION OF THE DRAWINGS

The above and other objects, features and advantages of the present invention will be made more apparent by the following description of the preferred embodiments thereof, with reference to the accompanying drawings, wherein.

DETAILED DESCRIPTIONS

Figure 1:
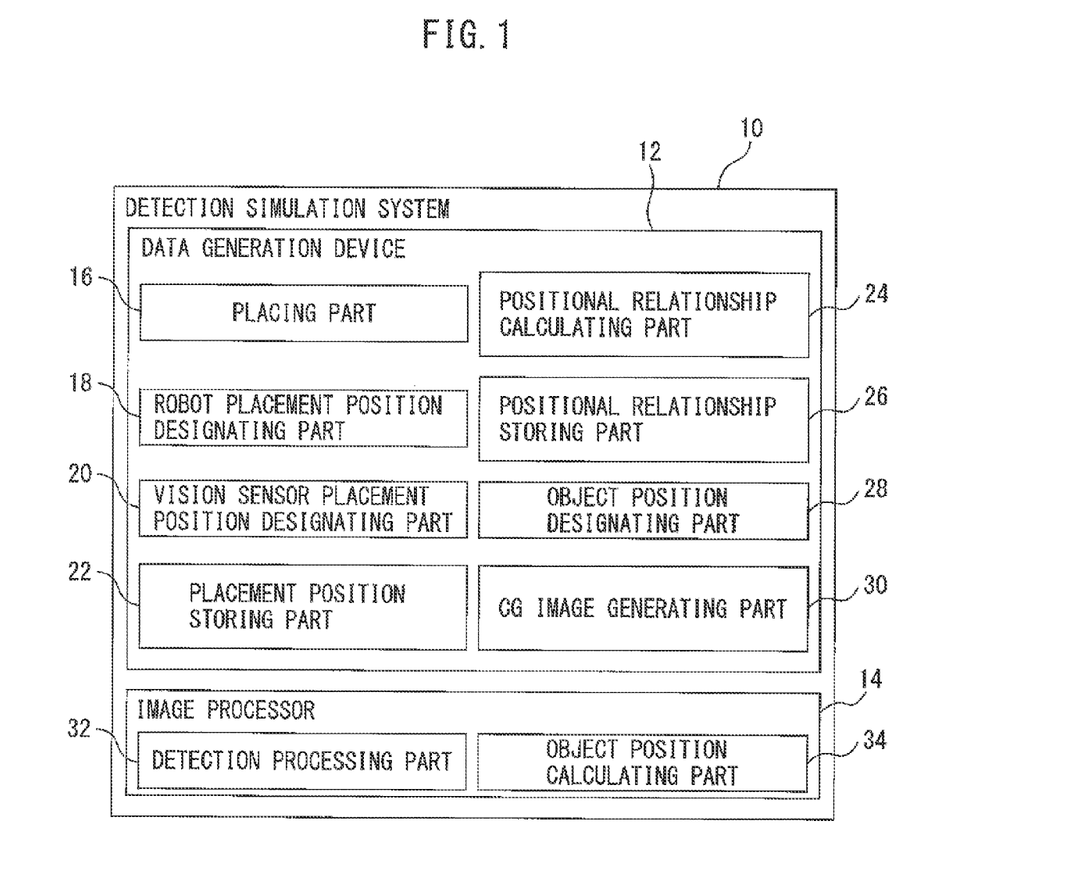
FIG. 1 is a functional block diagram of a detection simulation system according to an embodiment of the present invention.

FIG. 1 is a functional block diagram of a detection simulation system according to an embodiment of the present invention. Detection simulation system 10 includes a data generation device 12 which generates data necessary for a detection process using a vision sensor based on the positions of a robot, the vision sensor and an object positioned in a virtual space, and an image processor 14 which carries out the detection process of the position of the object by using the data.

Data generation device 12 has: a placing part 16 which places three-dimensional models of a robot, a vision sensor and an object in a virtual space; a robot placement position designating part 18 which designates a placement position of the robot in the virtual space based on a reference coordinate system defined in the virtual space; a vision sensor placement position designating part 20 which designates a placement position of the vision sensor in the virtual space based on the reference coordinate system; a placement position storing part 22 which stores the placement positions of the robot and the vision sensor; a positional relationship calculating part 24 which calculates a positional relationship between a robot coordinate system defined in relation to the robot and a sensor coordinate system defined in relation to the vision sensor, based on the placement positions of the robot and the vision sensor; and a positional relationship storing part 26 which stores the positional relationship between the robot coordinate system and the sensor coordinate system as data used in a detection process of the vision sensor; an object position designating part 28 which designates a position of the object in the virtual space based on the reference coordinate system; and a CG image generating part 30 which generates a computer graphics image which is a quasi-image corresponding to an image obtained when the object is captured by the vision sensor, based on a positional relationship between the vision sensor and the object.

On the other hand, image processor 14 has: a detection processing part 32 which carries out the detection process in relation to the computer graphics image by using the above data; and an object position calculating part 34 which calculates a position of the object based on a result of the detection process by detection processing part 32. Hereinafter, a procedure using detection simulation system 10 will be explained with reference to FIGS. 2 and 3.

Figure 2:
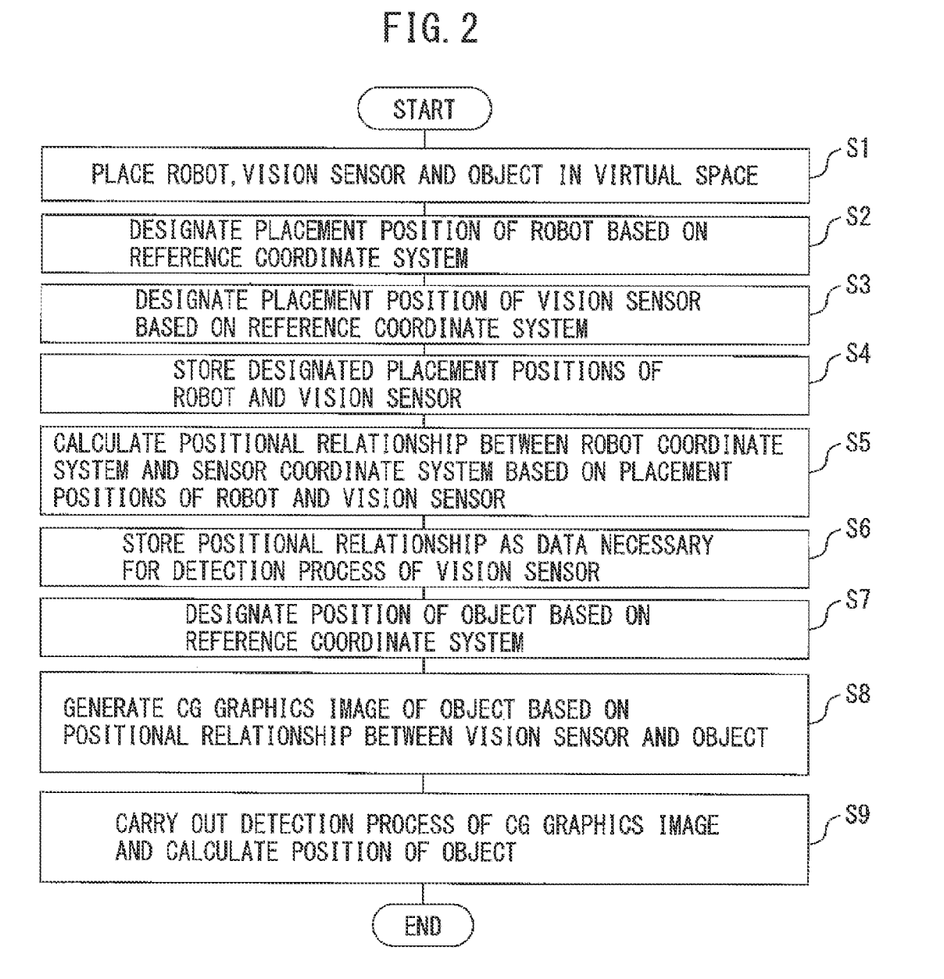
FIG. 2 is a flowchart showing a procedure of the detection simulation system of the present invention.
Figure 3:
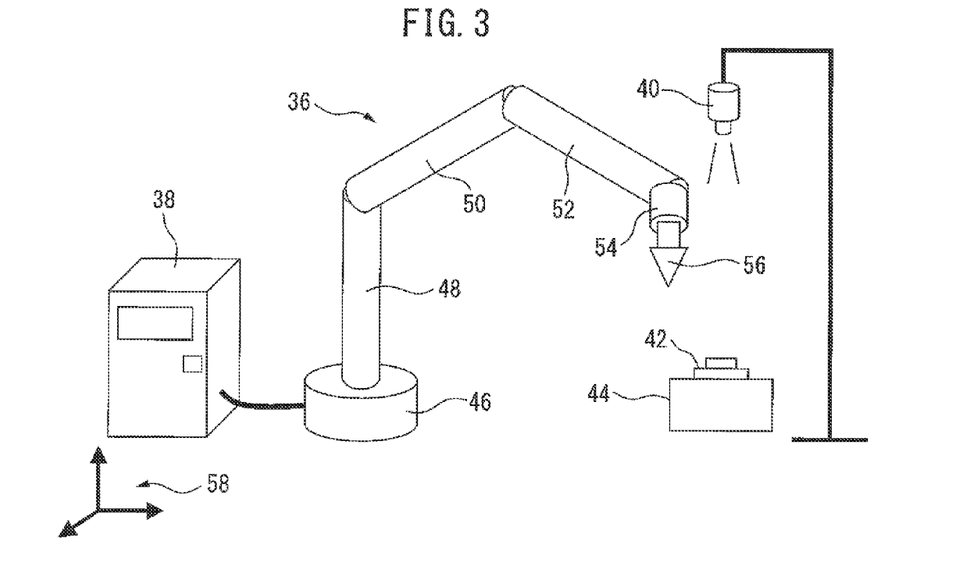
FIG. 3 shows a display example of a state wherein a robot, a vision sensor, a workpiece and a jig are placed in a virtual space.

FIG. 2 is a flowchart showing the procedure of detection simulation system 10, and FIG. 3 shows a display example of a state wherein the three-dimensional models of the robot, the vision sensor and the object are placed in the virtual space. First, as shown in FIG. 3, three-dimensional models of a robot 36, a controller 38 for controlling robot 36, a vision sensor 40 such as a camera, a workpiece 42, and a jig 44 for holding workpiece 42 are placed in the virtual space (step S1). In the illustrated embodiment, robot 36 is a six-axis multi-joint robot having a base 46, a rotating body 48 rotatably attached to base 46, an upper arm 50 rotatably attached to rotating body 48, a forearm 52 rotatably attached to upper arm 50, a wrist element 54 rotatably attached to forearm 52, and a work tool 56 attached to wrist element 54. In this case, a simulation can be executed, wherein a predetermined operation such as machining or welding of workpiece 42 is carried out.

Herein, the object captured by the vision sensor may include at least one of the workpiece and jig. In the embodiment, workpiece 42 held by jig 44 is captured by vision sensor 40. In the present invention, although it is necessary to place the robot, the vision sensor and the object in the virtual space, it is not necessary to display all of the robot, the vision sensor and the object on a screen, etc., which is visible to an operator.

Next, in step S2, based on a reference coordinate system 58 defined in the virtual space, a placement position of robot 36 in the virtual space is designated. Similarly, in step S3, based on reference coordinate system 58, a placement position of vision sensor 6 in the virtual space is designated. In the next step S4, the placement positions of robot 36 and vision sensor 40, designated in steps S2 and S3, respectively, are stored.

Figure 4:
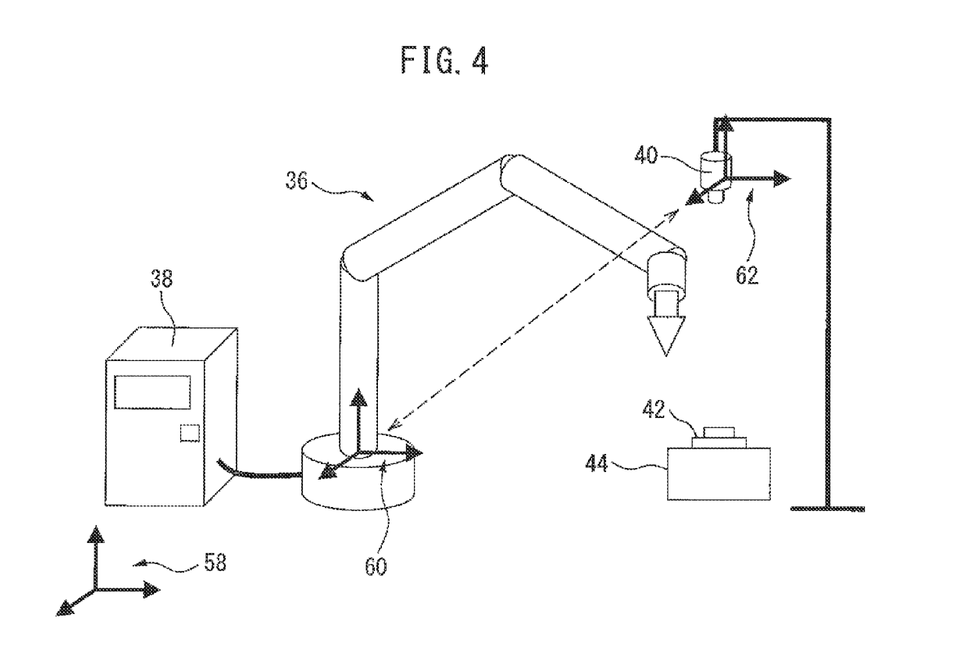
FIG. 4 shows a state wherein a robot coordinate system and a sensor coordinate system are defined in relation to the robot and the vision sensor in the virtual space, respectively.

Next, as shown in FIG. 4, a robot coordinate system 60 is defined in relation to robot 36, and similarly, a sensor coordinate system 62 is defined in relation to vision sensor 40. Then, based on the placement positions of robot 36 and vision sensor 40, a positional relationship between robot coordinate system 60 and sensor coordinate system 62 is calculated (step S5). For example, this positional relationship may be determined as a coordinate (X, Y, Z) of the origin of one of robot coordinate system 60 and sensor coordinate system 62, relative to the origin of the other of robot coordinate system 60 and sensor coordinate system 62. In the illustrated embodiment, both robot coordinate system 60 and sensor coordinate system 62 are orthogonal coordinate systems. However, at least one of the coordinate systems may be a polar coordinate system $(r, \theta, z)$.

Next, in step S6, the positional relationship calculated in step S5 is stored as data necessary for the detection process using vision sensor 40. The data may be stored in controller 38, or may be stored as a separate file. In addition, as the data necessary for the detection process using the vision sensor, except for the above positional relationship, a parameter such as a focal length, an image size (or the number of pixels), distortion of a lens, a pixel size, and an aspect ratio of the pixel, etc., of the vision sensor may be stored.

Figure 5:
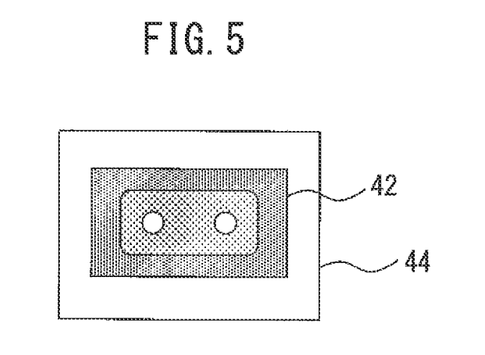
FIG. 5 shows an example of a CG image obtained by capturing the workpiece by means of the vision sensor.

In the next step S7, based on reference coordinate system 58, the placement position of the object (at least one of workpiece 42 and jig 44) in the virtual space is designated. Next, in step S8, based on a positional relationship between vision sensor 40 and workpiece 42 or jig 44, a computer graphics (CG) image, which is a quasi-image corresponding to an image obtained when workpiece 42 or jig 44 is captured by vision sensor 40, is generated. FIG. 5 shows an example of a CG image obtained by capturing workpiece 42 by means of vision sensor 40.

Figure 6:
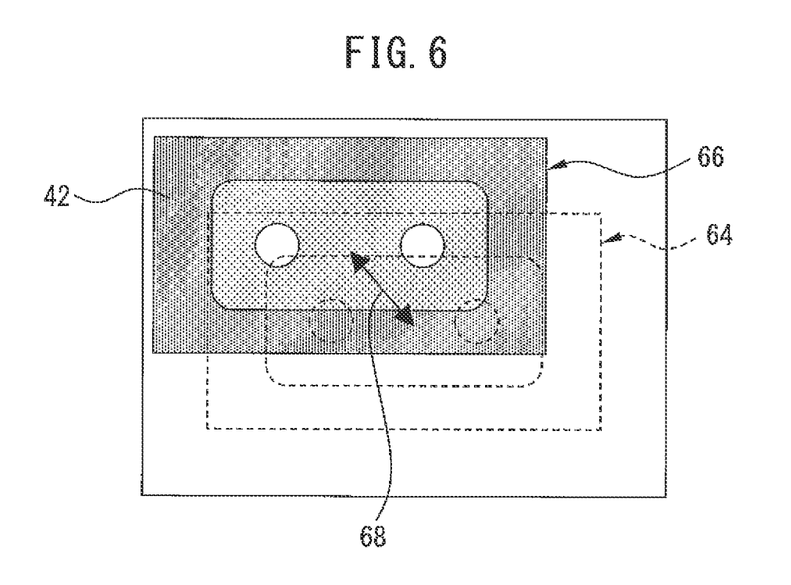
FIG. 6 shows an example wherein the position of the workpiece is corrected.

Finally, in step S9, by using the data necessary for the detection process of the vision sensor, the detection process is carried out in relation to the CG image generated in step S8, and then, based on a result of the detection process, the position of workpiece 42 or jig relative to robot 36 is calculated. In this process, if necessary, the parameter such as the focal length, the image size (or the number of pixels), the distortion of the lens, the pixel size, and the aspect ratio of the pixel, etc., of the vision sensor may be used. FIG. 6 shows an example of the procedure in step S9.

In relation to a reference capture position of the workpiece indicated by a dashed line 64, when a capture position of the workpiece, obtained by capturing workpiece 42 by means of vision sensor 40 under a certain condition in the virtual space, is a position indicated by reference numeral 66, a difference (or an amount of displacement) 68 between capture position 66 and reference capture position 64 corresponds to an amount of positional correction for workpiece 42 in this condition. By using the amount of positional correction, the position of workpiece 42 relative to vision sensor 40 can be calculated. Based on the positional relationship between vision sensor 40 and workpiece 42 calculated as above, and based on the stored positional relationship between robot (or robot coordinate system 60) and vision sensor 40 (or sensor coordinate system 62), the position of workpiece 42 relative to robot 36 can be calculated, whereby a precise offline simulation of the operation of robot 36 in relation to workpiece 42 can be carried out.

In the present invention, by calculating and storing the positional relationship between the robot (or the robot coordinate system) and the vision sensor (or the sensor coordinate system), a calibration for associating the robot and the vision sensor is not necessary. Therefore, the operator can carry out the simulation in a short time without using a special knowledge, whereby workload of the operator is significantly reduced.

Figure 7:
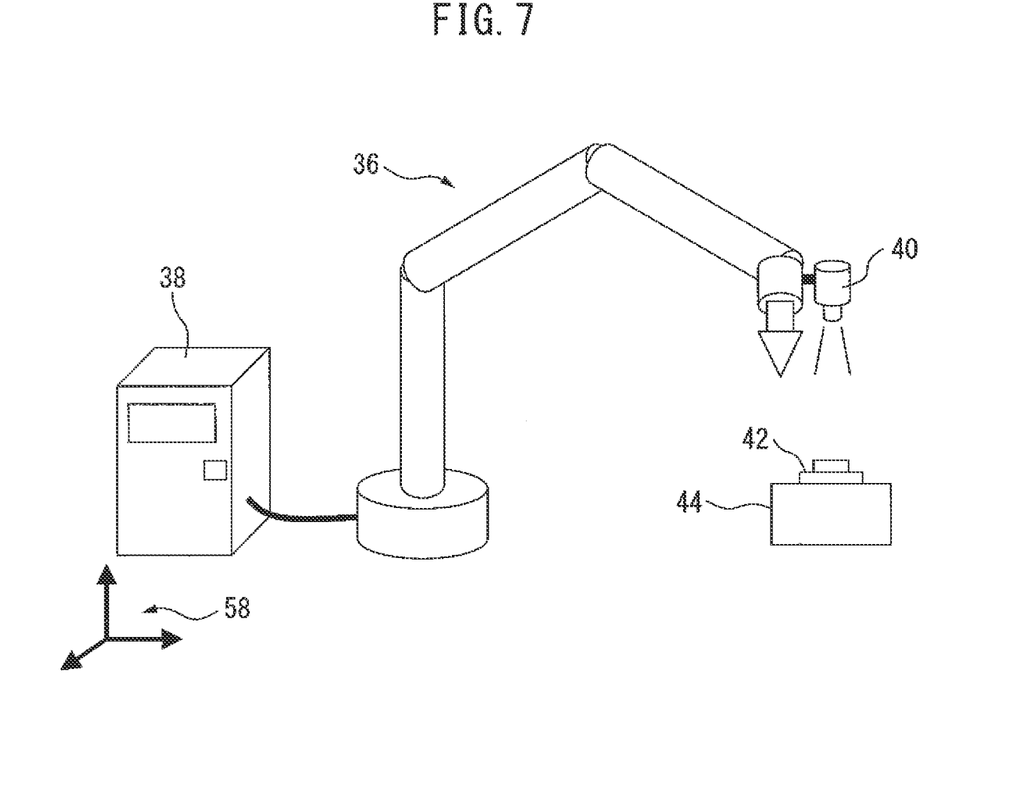
FIG. 7 shows an example wherein the vision sensor is attached to a movable part of the robot.

In the above embodiment, robot 36 and vision sensor 42 are separately positioned, and the position and orientation of vision sensor 40 are not changed by the motion of robot 36. However, in a modified embodiment as shown in FIG. 7, vision sensor 40 may be attached (or fixed) to a movable part (such as the forearm or the wrist element) or a link of the movable part of robot 36. Also in this case, similarly to the above embodiment, the position and orientation of vision sensor 40 can be calculated based on the position and the rotation angle of each axis of the robot, whereby the positional relationship between the robot (or the robot coordinate system) and the vision sensor (or the sensor coordinate system) can be calculated and stored.

In the data generation device according to the present invention, the data used for the detection process of the vision sensor can be generated based on the placement positions of the robot and the vision sensor. Therefore, it is not necessary to carry out calibration operation for associating the robot with the vision sensor, whereby special knowledge is not necessary, operation time is reduced, and workload of the operator can be significantly reduced.

While the invention has been described with reference to specific embodiments chosen for the purpose of illustration, it should be apparent that numerous modifications could be made thereto, by one skilled in the art, without departing from the basic concept and scope of the invention.

The invention claimed is:

1. A data generation device configured to generate data used in a detection process using a vision sensor, based on positions of a three-dimensional model of a robot, a three-dimensional model of the vision sensor and a three-dimensional model of an object which are positioned in a virtual space, the data generation device comprising:
   a robot placement position designating part configured to designate a placement position of the three-dimensional model of the robot in the virtual space based on a reference coordinate system defined in the virtual space;
   a vision sensor placement position designating part configured to designate a placement position of the three-dimensional model of the vision sensor in the virtual space based on the reference coordinate system;
   a placement position storing part configured to store the placement positions of the three-dimensional model of the robot and the three-dimensional model of the vision sensor;
   a positional relationship calculating part configured to calculate a positional relationship between a robot coordinate system defined in relation to the three-dimensional model of the robot and a sensor coordinate system defined in relation to the three-dimensional model of the vision sensor, based on the placement positions of the three-dimensional model of the robot and the three-dimensional model of the vision sensor, without carrying out a calibration for associating the robot with the vision sensor; and
   a positional relationship storing part configured to store the positional relationship between the robot coordinate system and the sensor coordinate system as data used in a detection process of the vision sensor.

2. The data generation device as set forth in claim 1, further comprising:
   an object position designating part configured to designate a position of the three-dimensional model of the object in the virtual space based on the reference coordinate system; and
   a CG image generating part configured to generate a computer graphics image which is a quasi-image corresponding to an image obtained when the object is captured by the vision sensor, based on a positional relationship between the vision sensor and the object.

3. A detection simulation system, comprising:
   the data generation device as set forth in claim 2; and
   an image processor configured to carry out a detection process of the object by using the data used in the detection process of the vision sensor.

4. The detection simulation system as set forth in claim 3, the image processor comprising:
   a detection processing part configured to carry out the detection process the object in relation to the computer graphics image by using the data; and
   an object position calculating part configured to calculate a position of the object based on a result of the detection process of the object carried out by the detection processing part.

5. The detection simulation system as set forth in claim 3, wherein the three-dimensional model of the vision sensor is attached to a movable part of the three-dimensional model of the robot.

6. The data generation device as set forth in claim 1, wherein the three-dimensional model of the vision sensor is attached to a movable part of the three-dimensional model of the robot.

\* \* \* \* \*